United States Patent
Bellaouar et al.

(10) Patent No.: US 9,806,701 B1
(45) Date of Patent: Oct. 31, 2017

(54) DIGITAL FREQUENCY MULTIPLIER TO GENERATE A LOCAL OSCILLATOR SIGNAL IN FDSOI TECHNOLOGY

(71) Applicant: GLOBALFOUNDRIES Inc., Grand Cayman (KY)

(72) Inventors: Abdellatif Bellaouar, Richardson, TX (US); Arul Balasubramaniyan, Plano, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/373,791

(22) Filed: Dec. 9, 2016

(51) Int. Cl.
| | |
|---|---|
| *H04B 1/38* | (2015.01) |
| *H03K 5/00* | (2006.01) |
| *H01L 27/12* | (2006.01) |
| *H01L 29/10* | (2006.01) |
| *H03L 7/081* | (2006.01) |
| *H03K 5/1534* | (2006.01) |
| *H04W 84/12* | (2009.01) |

(52) U.S. Cl.
CPC ..... *H03K 5/00006* (2013.01); *H01L 27/1203* (2013.01); *H01L 29/1079* (2013.01); *H03K 5/1534* (2013.01); *H03L 7/0814* (2013.01); *H03K 2005/00026* (2013.01); *H04W 84/12* (2013.01)

(58) Field of Classification Search
CPC ......... H03K 2005/00052; H03K 5/133; H03K 5/1534; G06F 1/3203; H03L 7/0991
USPC .................. 375/219, 260, 211; 327/116, 159; 324/76.55, 76.47, 76.48
See application file for complete search history.

(56) References Cited

U.S. PATENT DOCUMENTS 5,786,715 A * 7/1998 Halepete .............. H03K 3/0315
327/116

OTHER PUBLICATIONS

Patel,Kashyap K., Charge Pump, Loop Filter and VCO for Phase Lock Loop Using 0.18μm CMOS Technology, Journal, May-Jun. 2013, pp. 21-25, vol. 2, IOSR Journal of VLSI and Signal Processing.
Kumar R., A Fully Integrated 2×2 b/g and 1×2 a-Band MIMOWLAN SoC in 45nm CMOS for Multi-Radio IC, Journal, Feb. 30, 2013, pp. 328-330, IEEE International Solid-State Circuits Conference.

* cited by examiner

*Primary Examiner* — Rahel Guarino
(74) *Attorney, Agent, or Firm* — David Cain; Hoffman Warnick LLC

(57) ABSTRACT

A transformer-less DFM device comprising: an input receiving signals that are an integer multiple of an input signal; an edge detector that provides a quantized or a state output comparing an the input signal to a feedback signal; a statemachine that has counters and decimation circuits to provide a digitized output to a DAC that tunes delays between the input/output signals; a DLL for generating delay signals from the input signal that form an input to an edge combiner wherein the edge combiner takes different phases from the DLL to generate a multiplied output signal; a first DAC that takes the signal from the statemachine and provide a control to a supply circuit of the DLL to adjust a delay through a supply voltage; a second DAC that takes a signal from the statemachine and provides control to a backgate circuit of the DLL to adjust the delay.

18 Claims, 8 Drawing Sheets

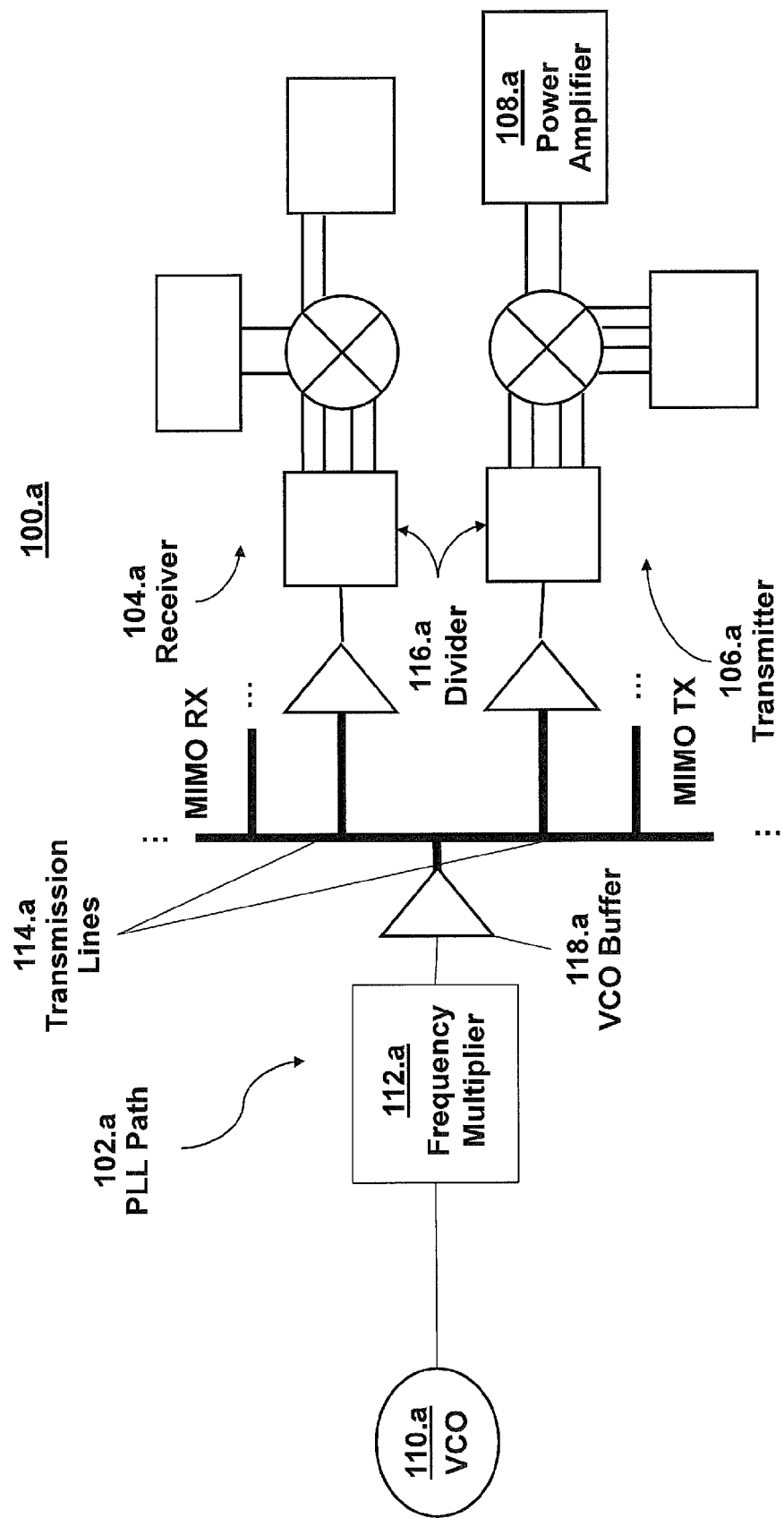
FIG. 1.a (Prior Art)

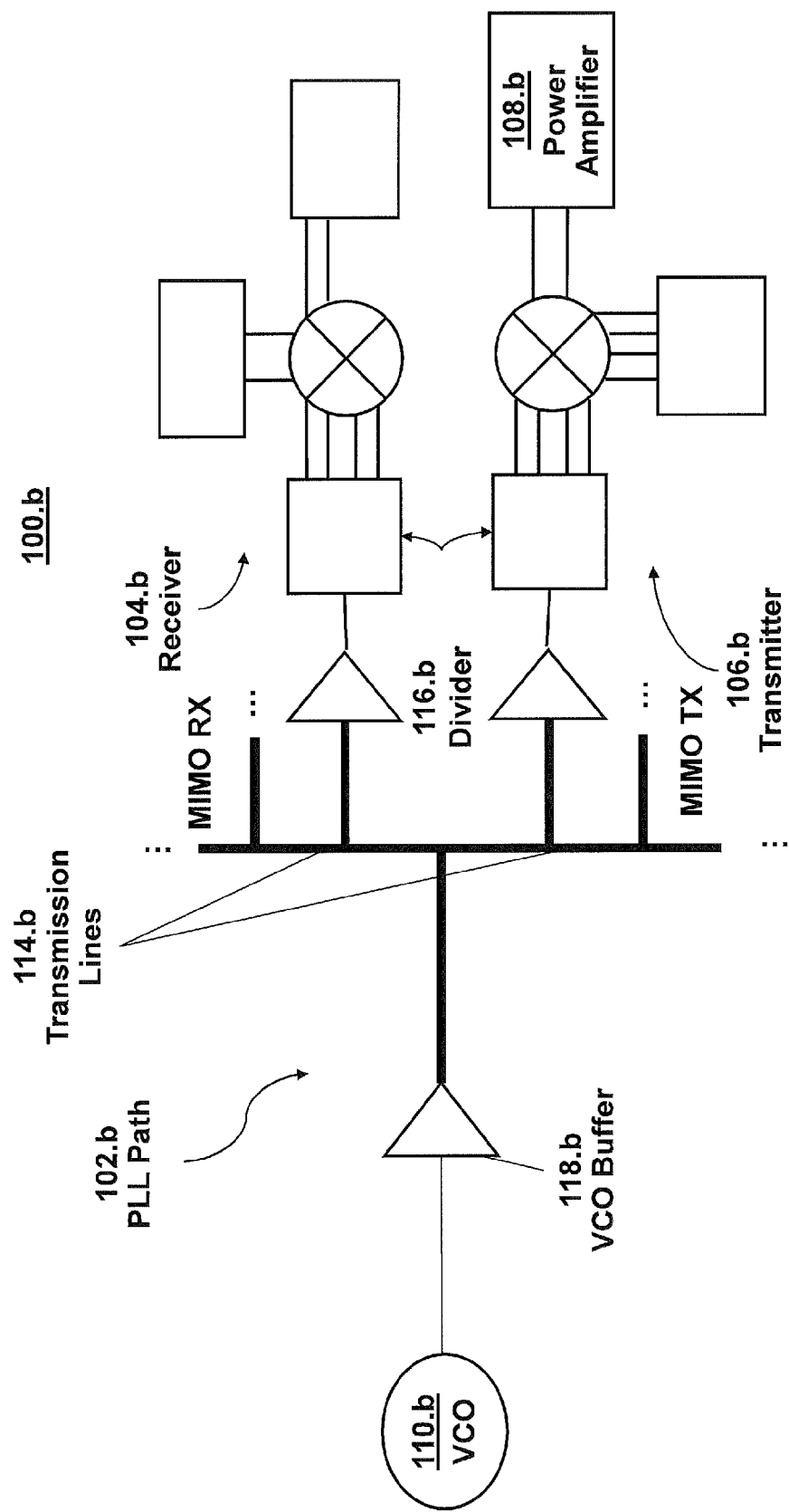
FIG. 1.b (Prior Art)

DIGITAL FREQUENCY MULTIPLIER TO GENERATE A LOCAL OSCILLATOR SIGNAL IN FDSOI TECHNOLOGY

TECHNICAL FIELD

The present disclosure relates to a VCO frequency integer multiplication device for a local oscillator generation solution to any wireless system and as an example we apply it in this disclosure to wireless local area network (WLAN) technologies using digital frequency multiplication (DFM) techniques with a digitally tuned delay-locked loop (DLL).

BACKGROUND

Radio frequency (RF) and phase locked RF signals are used in transceivers in WLAN technologies. These applications use control systems such as phase-locked loops (PLLs) and delay-locked loops (DLLs) to generate output signals in response to a given input signal. PLL and DLL technologies are used in a variety of different electronic applications including clock generation, time synchronization, and frequency multiplication. A DLL controls a voltage-controlled delay line, and can be used to change the phase of a clock signal to adjust the timing characteristics of an output signal. A PLL controls a voltage-controlled oscillator in order to bring its frequency (or some derivative of it) into phase (and frequency) lock with a reference signal.

A voltage controlled oscillator (VCO) is an electronic oscillator designed such that its oscillation frequency is controlled by a voltage input. These VCO frequencies are integer multiples of the actual receiver or transmitter frequencies in conventional non-Wi-Fi frequency multiplication applications. A conventional approach to signal frequency multiplication in Wi-Fi and WLAN applications involves the use of direct conversion receivers (RXs), or direct launch transmitters (TXs) that use a local oscillator (LO) with a mixer to form these frequencies. In Wi-Fi applications power amplifier (PA) is integrated into the transceiver (TRX), and therefore, a non-integer relationship is needed between the actual RF and the synthesized LO frequency to avoid a pulling effect where the output of PA and its harmonics will affect the LO frequency. In both conventional applications, the higher that the VCO or LO frequencies need to be (e.g., 9.65-11.65 GHz), the higher the power necessary to reach that frequency in the PLL, the VCO/LO, and the multiple input multiple output (MIMO) circuitry between the transmitter and receiver.

Frequency multiplication in these conventional Wi-Fi applications may also utilize mixer-based multipliers that make use of transformers. This mixer based multiplier reduces the VCO (e.g., 3.2-3.9 GHz) frequency and thereby reducing power consumption. Additionally, because the mixer based approach uses a transformer, the circuit could still be affected by harmonic coupling with the Power Amplifier (PA). For multiple input, multiple output (MIMO) applications the transformer based multiplier if located in the receiver or the transmitter would also be repeated at a significant area cost. If the multiplier is located closer to the VCO, then the higher frequency multiplied signal must be routed to multiple receivers or transmitters and would increase the power requirements of the device.

Other than a mixer based approach, a DLL may be used but is usually paired with an analog charge pump (ACP) and a low pass filter (LPF). This analog approach significantly increases the die area, and the present disclosure removes the ACP and the LPF through utilization of a digital calibration and tuning technique.

Referring to FIG. 1.*a*, a block diagram of a conventional multiple input multiple output (MIMO) local oscillator generator transceiver (TRX) Wi-Fi device 100.*a* with a transmitter (TX) 106.*a* and a receiver (RX) 104.*a* is shown. MIMO TRX Wi-Fi device 100.*a* includes a VCO 110.*a* coupled to a frequency multiplier device 112.*a* that drives both the RX 104.*a* and TX 106.*a* which utilize conventional multiple input multiple output (MIMO) circuitry through a VCO buffer 118.*a*. Device 100.*a* includes a power amplifier 108.*a* in the TX 106.*a* which under normal operation generates some harmonic of RF TX frequency. Additionally, the VCO 110.*a*'s frequency has to go through a frequency multiplier device 112.*a*, such as a frequency tripler that has the disadvantages of high power consumption due to this frequency multiplier 112.*a*, power amplifier 108.*a* and increased device space. The frequency multiplier and along with the divider 116.*a* in RX and TX for a non-integer relationship between PA output frequency and VCO frequency, thereby avoiding frequency pulling effects on VCO. This is done in the current prior art and it avoids the pulling issue shown in FIG. 1.*b* on a conventional transceiver. However, if the frequency multiplier is close to VCO then the multiplied high frequency has to be driven on long MIMO transmission lines 114.*a* that increase power consumption. To avoid this power consumption the multiplier can be placed close to RX and TX but we need multiple frequency multipliers that will increase area exponentially with the number of MIMO's and the power consumption increase due to multiple frequency multipliers being used. The current disclosure using DFM has significantly small area and low power consumption and can be placed closed to RX and TX thereby saving significant power due Transmission lines being driven at a lower VCO frequency.

To overcome the issue of PA harmonics existing prior art uses a frequency multiplier (e.g., 3×) which is then divided (e.g., by 2) to establish a non-integer relationship between the TRX and VCO. Therefore the PA harmonics have no integer relationship to the VCO.

Alternatively, a conventional MIMO TRX could possess a VCO that operates at multiples (e.g., 2× or 4×) of the frequency. This would allow for a device which would forego the use a frequency multiplier circuit. The multiplied frequency of the VCO without the frequency multiplier circuit must again be divided (e.g., by 2) to establish the non-integer relationship between the TRX and VCO. Therefore the PA harmonics have no integer relationship to the VCO.

Referring to FIG. 1.*b*, a block diagram of a conventional multiple input multiple output (MIMO) local oscillator generator TRX Wi-Fi device 100.*b* with a TX 106.*b* and a RX 104.*b* is shown. TRX Wi-Fi device 100.*b* includes a VCO 110.*b* that drives both the RX 104.*b* and TX 106.*b* through a VCO buffer 118.*b*, which utilize conventional MIMO circuitry with VCO 110.*b* operating at multiple integers of the desired output frequency to the signal divider 116.*b* of the MIMO TRX. MIMO local oscillator generator TRX Wi-Fi device 100.*b* includes a power amplifier 108.*b* in the TX 106.*b* which under normal operation generates some harmonic of RF TX frequency. During normal operation of the power amplifier 108.*b*, the harmonics effects the VCO 110.*b* through a pulling effect that may compromise the signal integrity of the oscillator. Additionally, since VCO 110.*b*'s frequency does not utilize a through a frequency multiplier device it has the disadvantages of high power consumption due it being driven at a relatively high operating frequency (e.g., 9.65-11.65 Ghz) and increased noise due to driving the long length of the transmission lines 114.*b* of the MIMO TRX Wi-Fi device 100.*b*

SUMMARY

A first aspect of a transformer-less digital frequency multiplier (DFM) device using an input receiving a RF_IN signal and a RF_OUT out signal that is an integer multiple of the RF_IN signal; an edge detector that provides a quantized or a state output comparing the RF_IN signal and a RF_FB signal that determines if the RF_FB signal is ahead or delayed to the RF_IN signal; a statemachine that has counters and decimation circuits to provide a digitized output to a digital to analog converter (DAC) that tunes delays between the RF_IN and the RF_OUT signals; a digital delay-locked loop (DLL) for generating delay signals from the RF_IN signal that form an input to an edge combiner wherein the edge combiner takes different phases from the DLL to generate a RF_IN multiplied output signal as a second RF_OUT signal; a first DAC that takes the digital word from the statemachine and provide an analog control to a supply circuit of the DLL to adjust a delay through a supply voltage; a second DAC that takes a digital word from the statemachine and provide analog control to a backgate circuit of the DLL to adjust the delay though a backgate voltage.

A second aspect is a method to perform low power scalable local oscillator frequency generation using digital frequency multiplication through receiving a RF_IN signal and a RF_FB signal at an edge detector; generating a quantized output that determines the whether the RF_FB signal is ahead or delayed the RF_IN signal; generating a first set of delay signals with a digital delay-locked loop (DLL) that produces a set of different phases from the RF_IN signal as inputs for an edge combiner wherein the edge combiner takes in different phases from the digital DLL and produces an integer multiplied output of RF_IN signal called a RF_OUT signal; and an output time delay of the digital DLL is a function of a supply and a backgate voltage, and wherein varying the supply or backgate voltage changes the output the time delay of a set of DLL signals.

A third aspect is a transceiver system for using a digital frequency multiplier (DFM) to generate an integer multiplied signal using an input receiving a RF_IN signal and a RF_FB signal that is an integer multiple of the RF_IN signal; an edge detector that provides a quantized comparing the RF_IN signal and a RF_FB signal a statemachine that has a plurality of counters and a plurality of decimation circuits, that takes receives an output of an edge detector to provide a digitized output signal to a digital to analog converter (DAC) that tunes a set of delays between the RF_IN and the RF_FB signals through supply and backgate circuits. a digital delay-locked loop (DLL) for generating delay signals from the RF_IN signal that form an input to an edge combiner wherein the edge combiner takes different phases from the DLL to generate a RF_IN multiplied output signal as a RF_OUT signal; and a DAC that takes the a digital word from a the statemachine and provide an analog control to a supply circuit of the DLL to adjust delay through a supply voltage and a backgate voltage

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1.*a* shows a block diagram of a conventional local oscillator generator TRX Wi-Fi device using a frequency multiplier.

FIG. 1.*b* shows a block diagram of a conventional local oscillator generator TRX Wi-Fi device with a high VCO frequency without the use of a frequency multiplier.

It is noted that the drawings of the disclosure are not necessarily to scale. The drawings are intended to depict only typical aspects of the disclosure, and therefore should not be considered as limiting the scope of the disclosure.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The embodiments described herein are to provide an integer multiplied, such as three times, local oscillator frequency generation solution for example, in Wi-Fi and WLAN technologies. These embodiments utilize a digital frequency multiplication (DFM) device where the DFM device is based on digitally tuned DLLs to generate a multiplier of a chosen integer number.

The present approach is a digital implementation and therefore scalable with any given technology in area and power savings without being pulled by power amplifier (PA) harmonics. When the input of the PA is a non-integer, then its output and the harmonics from the PA do not pull the VCO. It can also be understood that the present embodiments of this invention do not require frequency triplers with their paired transformers like they were required in the prior art. Additionally, since in the present embodiments the DFM using DLL tuning is done in a digital domain, it will not be necessary to include conventional analog charge pumps and low pass filters which will result in a lower required die area.

Figure 2:
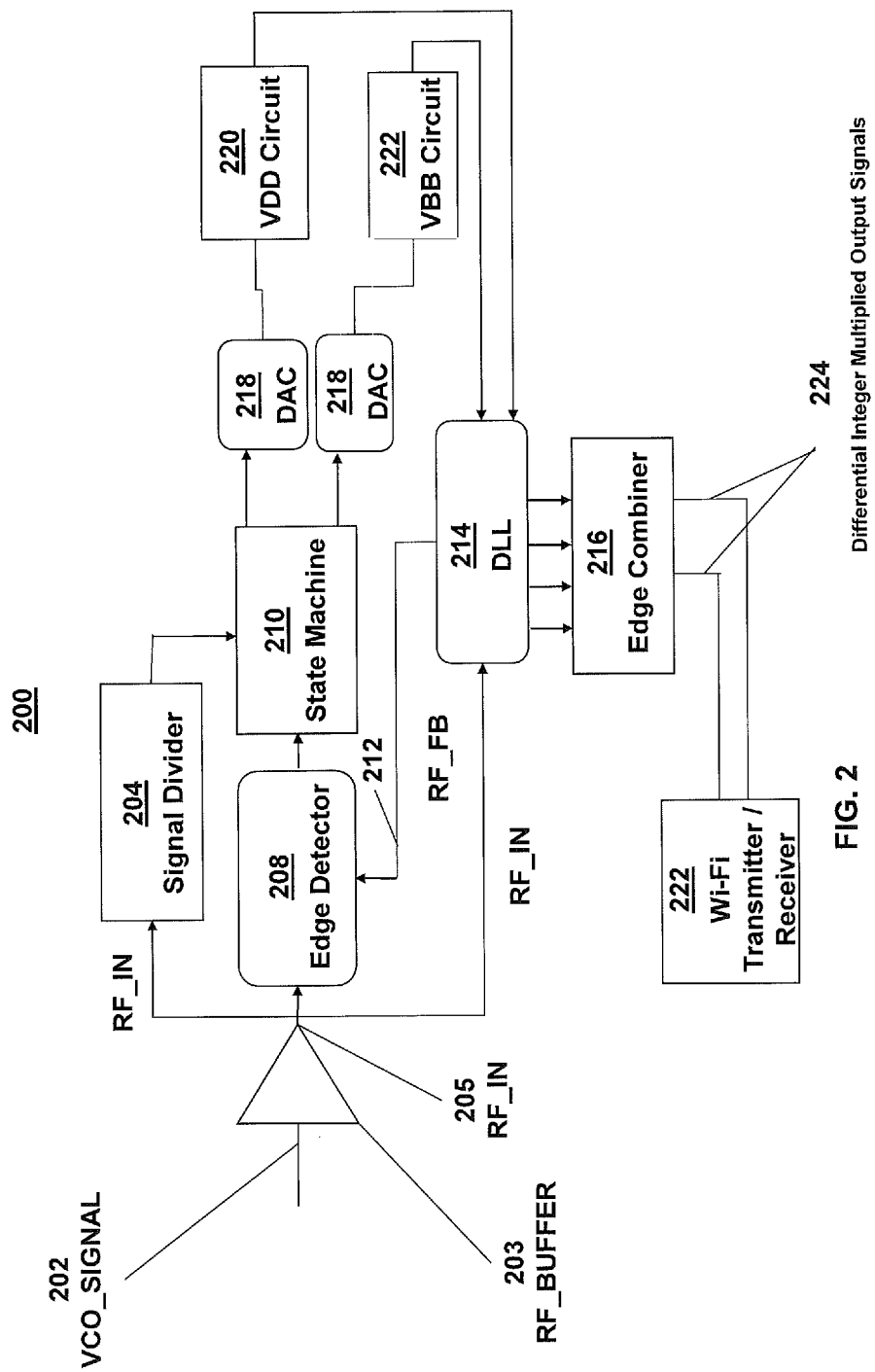
FIG. 2 shows a block diagram structure of a DFM device according to embodiments of the present disclosure.

Referring to FIG. 2, a block diagram of a digital frequency multiplication delay-locked loop (DFM-DLL) system 200 is shown according to one embodiment of the present invention. System 200 generally includes an incoming VCO Signal 202 which is RF buffered 203, an edge detector 208, a statemachine 210, a DLL 214 and an edge combiner 216. The DLL is tuned by Supply and Backgate circuits which take inputs from DAC driven by the statemachine. The statemachine 210 has counters and decimation circuits to provide a digitized output to a set of digital to analog converters (DACs) 218. In this DFM-DLL system 200, input signal (RF_IN) 205 and a DLL 214 feedback signal (RF_FB) 212 are connected to an edge detector 208 that generates a digitized state (1 or 0), depending if the RF_RB signal 212 is ahead or behind RF_IN signal 205, for the input of statemachine 210. The statemachine takes in a clock and the input of edge detector and produced a digitized output for DACs 218 that control the supply (VDD) circuit 220 and backgate (VBB) circuit 222 of the DLL 214. The DLL 214 is configured to respond to variations in the VDD circuit 220 or the VBB circuit 222 by adjusting the time delay. The statemachine 210, replaces the charge pump and low pass filter in a traditional analog implementation has counters that count up or down depending on the input from edge detector and the counter output is "decimated" to a predetermined resolution (number of bits) for the DACs 218. Phased output signals of DLL 214 are then processed by edge combiner 216 to generate integer multiplied RF output signals as the new LO frequency that is a integer multiple of RF_IN. There are two calibrations of DLL—Supply calibration is used for process variation of Silicon and its done one time and the calibrated value for Supply DAC is stored. The second DLL calibration is done realtime as the frequency of Wireless LAN changes. The delay tuning is done within few microseconds to respond to the change in frequency using the backgate. This is another significant advantage of DFM—fast response/lock time.

Figure 3:
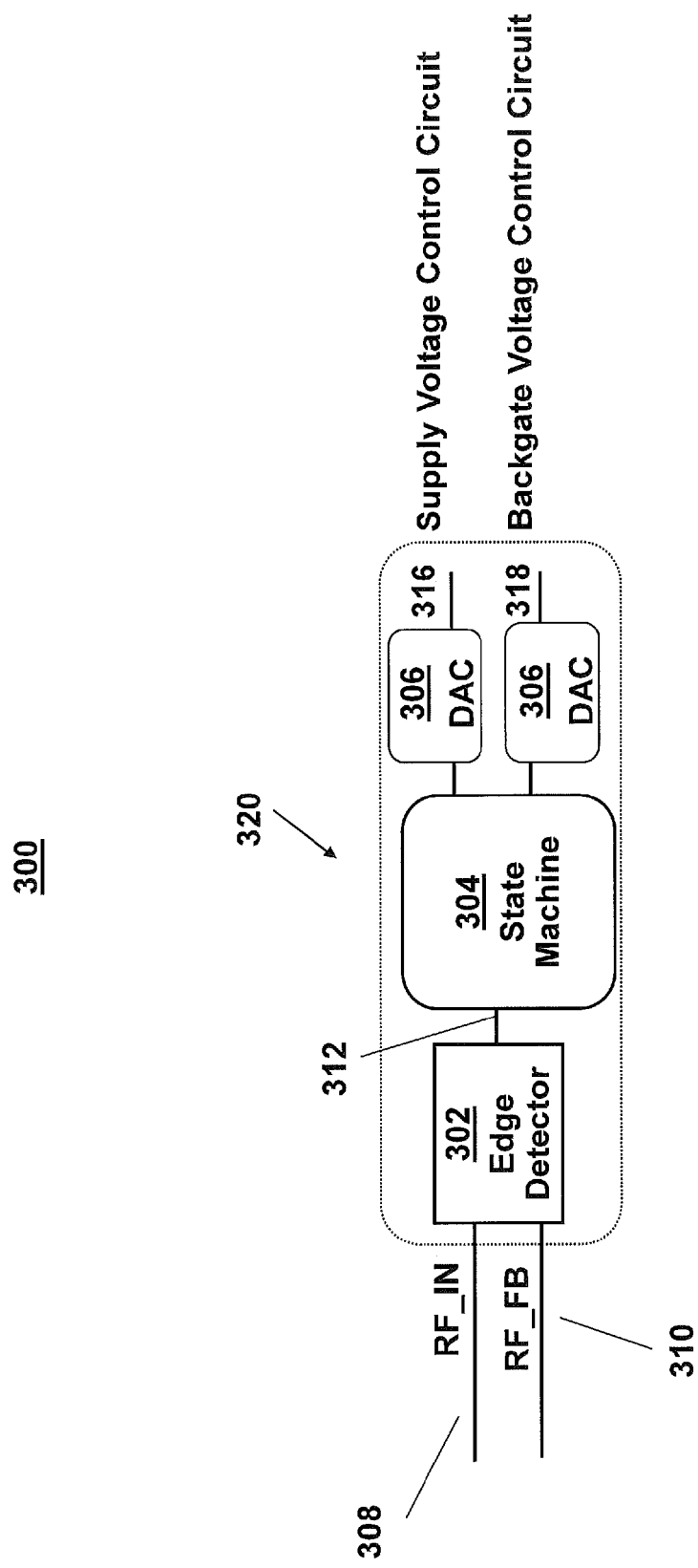
FIG. 3 shows a block diagram of a digital implementation of tuning DLL as a DFM device according to embodiments of the present disclosure.
Figures 4A, 4B:
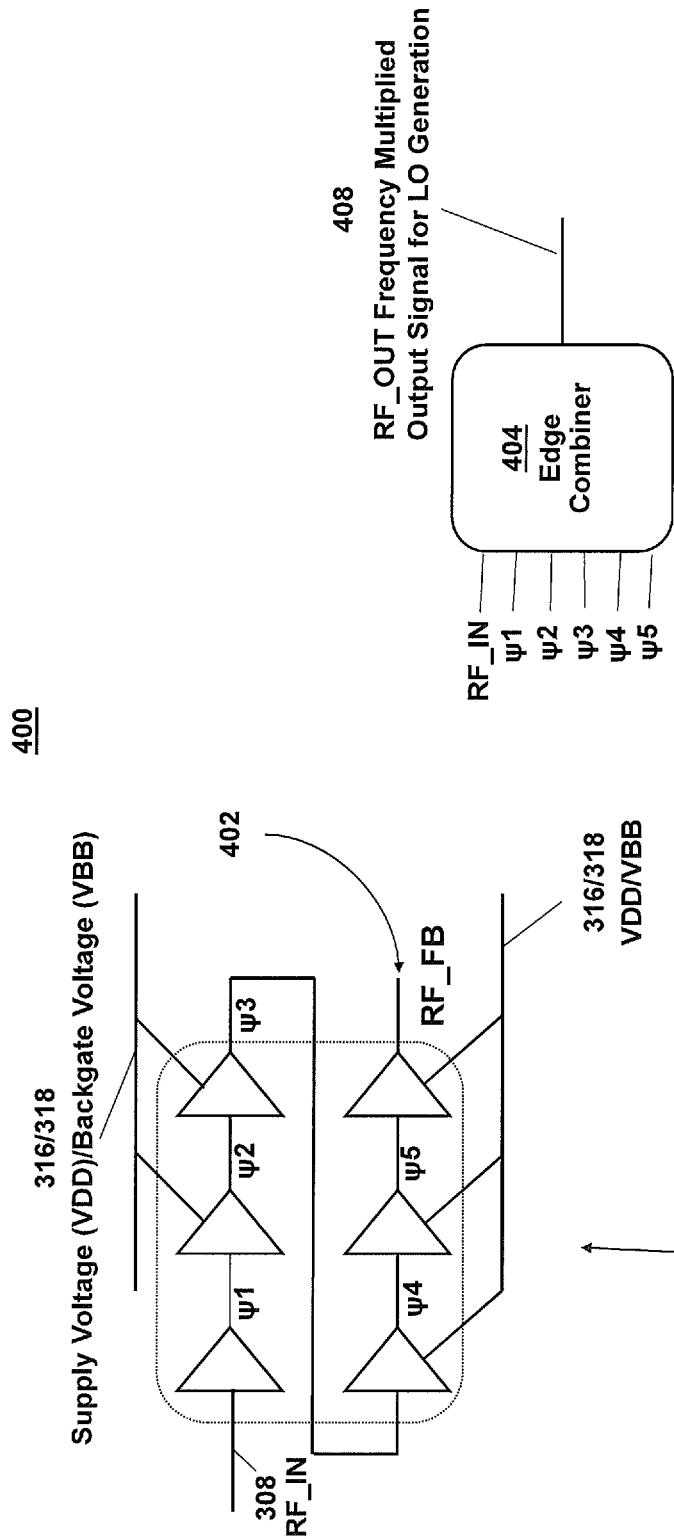
FIG. 4(*a*) shows a block diagram of the time delay device and FIG. 4(*b*) shows the input and combined outputs of an edge detector.

Referring to FIG. 3 and FIGS. 4(a) and 4(b), a block diagram is provided that shows the components of the DFM device 300 and digital implementation of digital delay locked loop 320 according to one embodiment of the current invention. The delay line is tuned using an edge detector 302, and a statemachine 304, and two DACs 306. The statemachine 304 has counters and decimation circuits to provide a digitized output to a DACs 306. The edge detector 302 samples the connected incoming RF_IN signal 308 and RF_FB signal 310 and generates a digitized signal when the selected edge of the input signal is detected. The edge detector 302 compares RF_IN 308 and RF_FB 310 and provides a digitized output signal 312. The finite statemachine (statemachine) 304 takes the output of the edge detector 302 and provides a digitized output to tune the DLL supply voltage control circuit 316 and backgate voltage control circuit 318 to be used in the tuning of a DLL.

Referring to FIG. 3, FIGS. 4(a) and 4(b), is one illustrated overview 400 of the digital tuning of the delay line 402. The phase diagram of the DLL phase generator 406 shows that the phases of the signals that compose the inputs into the edge combiner 404 are such that the output time delay of the digital delay line 402 is a function of the supply voltage central circuit 316, and a function of the backgate voltage central circuit 318. Accordingly, when varying the supply voltage central circuit 316 or the backgate voltage central circuit 318 the DLL phase generator 406 will be adjusting the time delay of subsequent phases ($\psi 1 \ldots \psi 5$) with the delay adjusted through the supply voltage VDD 316 and the FDSOI backgate voltage VBB 318. The edge combiner 404 combine each set of delay signals to generate a RF_OUT Frequency Multiplied Output Signal for LO Generation 408.

Figure 5B:
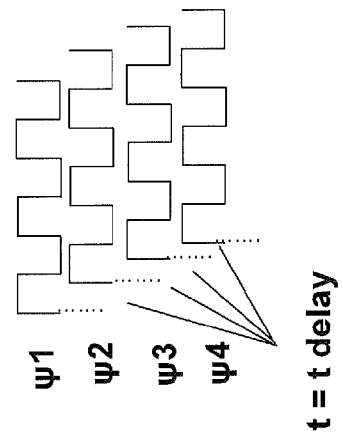
FIG. 5(*a*) shows a schematic of one embodiment of a time delay device, and FIG. 5(*b*) shows one example of the time delayed signals generated by the time delay device.
Figure 5A:
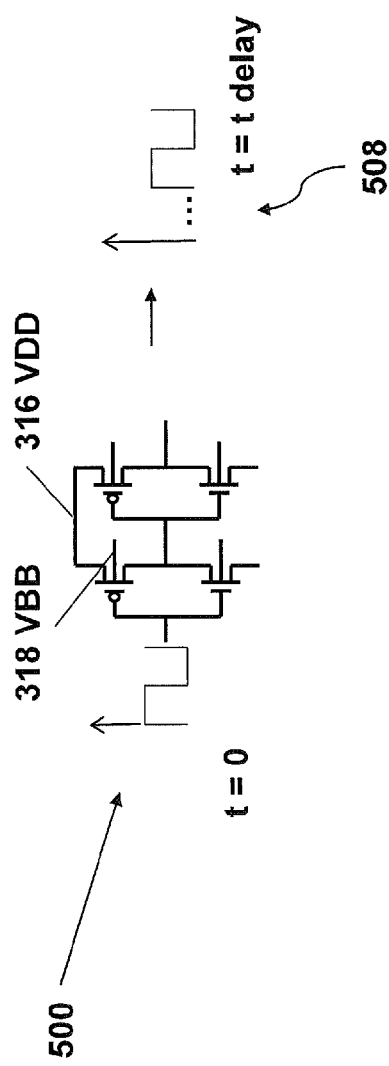

Referring to FIG. 5(a) and FIG. 5(b), one embodiment of a time delay cell 500 (FIG. 5(a)), and one example of the phased time delayed output signals (FIG. 5(b)) generated by the time delay cell 500 are shown. Time delay cell 500 generates a time delayed signal 508 that is a function of the backgate voltage 318, and the supply voltage 316. Adjusting the backgate voltage 318 or supply voltage 316 changes the delay of the time delayed output signals (FIG. 5(b)). The resulting time delayed output signals (FIG. 5(b)) are shown to illustrate one set of phase shifted DLL signals that will be utilized as inputs to the edge combiner 404 (FIG. 4(b)).

Figure 6:
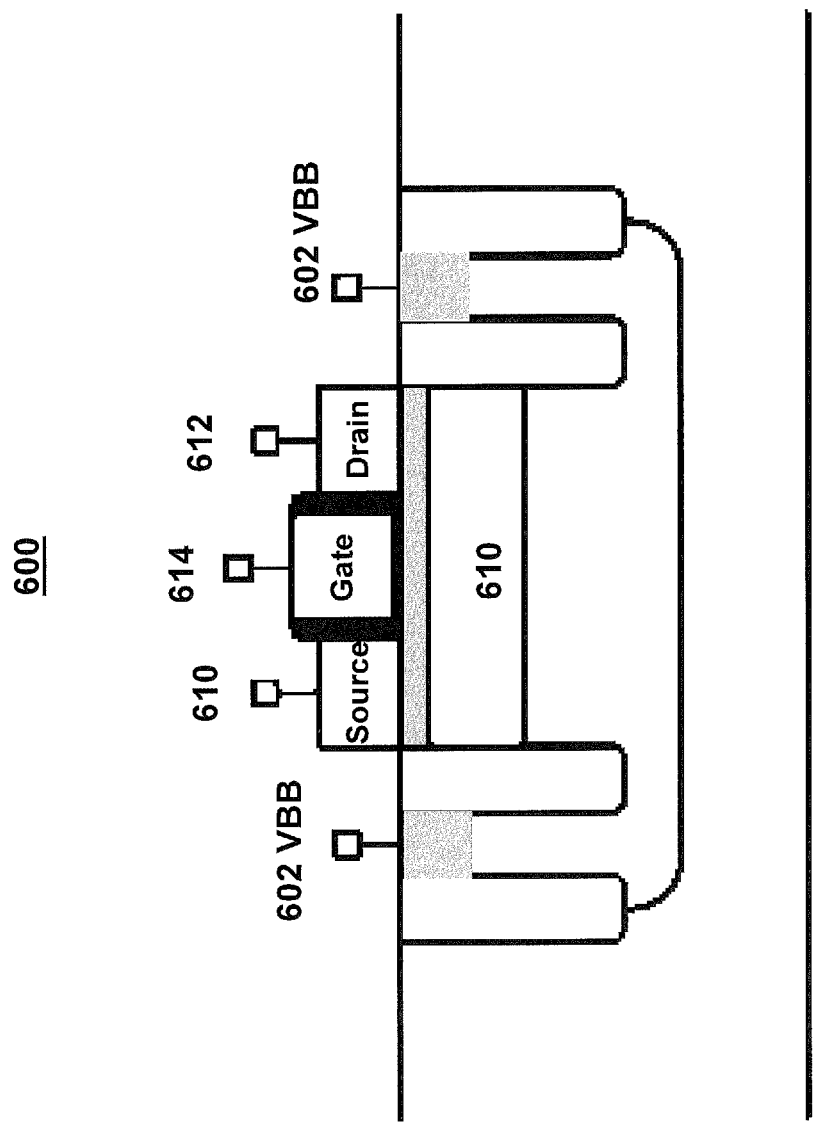
FIG. 6 shows an example device in FDSOI technology used in a DFM with backgate control to tune the delay in DLL layout of a DFM device according to one embodiment of the present disclosure.

Referring to FIG. 6, a 22 nm fully depleted silicon on insulator (FDSOI) device layout 600 for backgate voltage 602 control according with one embodiment of this invention is shown. FDSOI device layout 600 is composed of a source region 610, drain region 612 and a gate region 614 and a backgate region. This FDSOI device layout 600 is just one illustrative embodiment, and in no way should this illustration limit this disclosure from being applied in other configurations.

Figure 7:
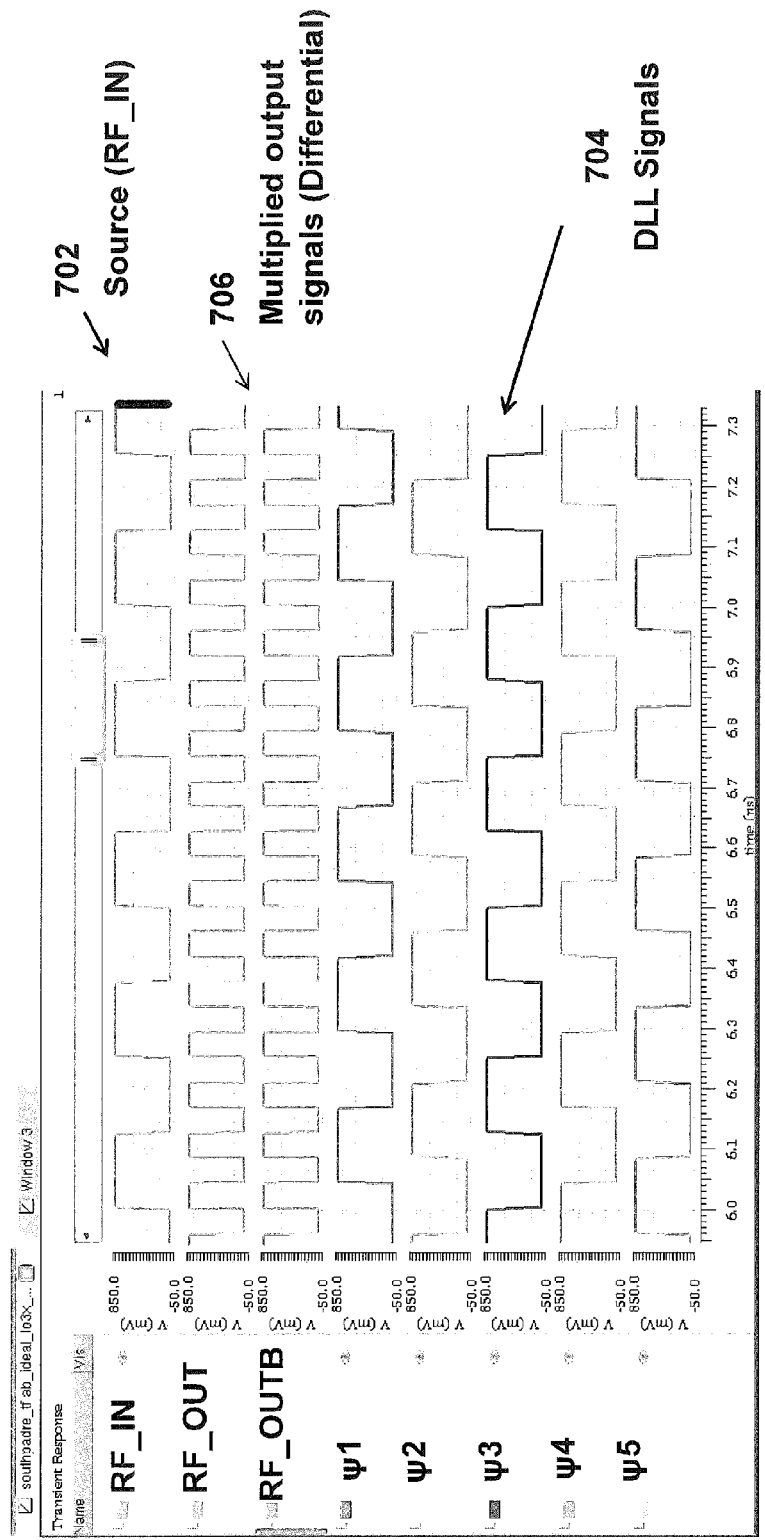
FIG. 7 shows an example signal diagram of the DLL input and output signals at the edge combiner according to embodiments of the present disclosure.

Referring to FIG. 7, the graph shows a set of input signals and output signals 700 of one embodiment of this transformer-less DFM device according to one embodiment of this invention. Shown is the source signal 702, and the resulting phased delay-locked signals 704 that make up the DLL input signals 704 to the statemachine and edge combiner that produces the combined multiplied output signals 706.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transformer-less digital frequency multiplier (DFM) device comprising:
    an input receiving a RF_IN signal and a RF_OUT out signal that is an integer multiple of the RF_IN signal;

an edge detector that provides a quantized or a state output comparing the RF_IN signal and a RF_FB signal that determines if the RF_FB signal is ahead or delayed to the RF_IN signal;

a statemachine that has counters and decimation circuits to provide a digitized output to a set of digital to analog converters (DACs) that tunes delays between the RF_IN and the RF_OUT signals;

a digital delay-locked loop (DLL) for generating delay signals from the RF_IN signal that form an input to an edge combiner wherein the edge combiner takes different phases from the DLL to generate a RF_IN multiplied output signal as a second RF_OUT signal;

a first DAC of the set of DACs that takes a digital word from the statemachine and provide an analog control to a supply circuit of the DLL to adjust a delay through a supply voltage; and a second DAC of the set of DACs that takes a digital word from the statemachine and provide analog control to a backgate circuit of the DLL to adjust the delay though a backgate voltage.

2. The DFM device of claim 1, further comprising a Wi-Fi transmitter/receiver.

3. The DFM device of claim 1, wherein varying the supply voltage changes an output time delay of an at least one delay cell in the DLL to synchronize the RF_OUT signal and the RF_IN signal.

4. The DFM device of claim 1, wherein an output time delay of the DLL is also a function of the backgate voltage.

5. The DFM device of claim 4, wherein varying the backgate voltage also changes an output time delay of an at least one delay cell in DLL to synchronize RF_OUT signal and the RF_IN signal.

6. The DFM device of claim 1, wherein the statemachine further processes an output of the edge detector to provide a set of quantized outputs that drive the first DAC and the second DAC.

7. The DFM device of claim 1, further comprised of statemachine that comprises a series of counters and a series decimation circuits in order to provide a set of quantized outputs that drive the first DAC and the second DAC.

8. The DFM device of claim 1, wherein the DFM device is implemented using Fully-Depleted Silicon-On-Insulator (FD-SOI) technology using a backgate.

9. The DFM device of claim 1, wherein the DFM device is implemented using Partially-Depleted Silicon-On-Insulator (PD-SOI) technology that has a device with a bulk layer.

10. A method to perform low power scalable local oscillator frequency generation using digital frequency multiplication, comprising:

receiving a RF_IN signal and a RF_FB signal at an edge detector;

generating a quantized output that determines whether the RF_FB signal is ahead or delayed to the RF_IN signal;

generating a first set of delay signals with a digital delay-locked loop (DLL) that produces a set of different phases from the RF_IN signal as inputs for an edge combiner wherein the edge combiner takes in different phases from the digital DLL and produces an integer multiplied output of RF_IN signal called a RF_OUT signal; and an output time delay of the digital DLL is a function of a supply voltage and a backgate voltage, and wherein varying the supply voltage or backgate voltage changes the output time delay of a set of DLL signals.

11. The method of claim 10, wherein varying the backgate voltage also changes an output time delay of the RF_IN signal to generate set of multiple phases for the edge combiner.

12. The method of claim 10, further comprised of adjusting a voltage of the RF_IN signal and a voltage of the RF_OUT signal.

13. The method of claim 10, further comprising an application in a Wi-Fi transmitter/receiver.

14. The method of claim 10, wherein the method is implemented using Fully-Depleted Silicon-On-Insulator (FD-SOI) technology.

15. A transceiver system for using a digital frequency multiplier (DFM) device to generate an integer multiplied signal comprising;

an input receiving a RF_IN signal and a RF_FB signal that is an integer multiple of the RF_IN signal;

an edge detector that provides a quantized output comparing the RF_IN signal and the RF_FB signal;

a statemachine that has a plurality of counters and a plurality of decimation circuits that receives an output of the edge detector to provide a digitized output signal to a digital to analog converter (DAC) that tunes a set of delays between the RF_IN and the RF_FB signals through supply and backgate circuits;

a digital delay-locked loop (DLL) for generating delay signals from the RF_IN signal that form an input to an edge combiner wherein the edge combiner takes different phases from the DLL to generate a RF_IN multiplied output signal as a second RF_OUT signal; and a DAC that takes a digital word from the statemachine and provide an analog control to a supply circuit of the DLL to adjust delay through a supply voltage and a backgate voltage.

16. The system of claim 15, further comprising a Wi-Fi transmitter/receiver.

17. The system of claim 15, wherein the DFM device is implemented using Fully-Depleted Silicon-On-Insulator (FD-SOI) technology.

18. The system of claim 15, wherein the DFM device is implemented using Partially-Depleted Silicon-On-Insulator (PD-SOI) technology.

* * * * *